United States Patent [19]

Rizzo et al.

[11] 4,340,164

[45] Jul. 20, 1982

[54] MASK FOR AN ATTACHABLE, CIRCUIT-TERMINATING, CIRCUIT BOARD EDGE MEMBER

[75] Inventors: Salvatore P. Rizzo, Foxboro; William J. LaPlante, Rehoboth, both of Mass.

[73] Assignee: Texas Instruments Incorporated, Dallas, Tex.

[21] Appl. No.: 154,269

[22] Filed: May 29, 1980

[51] Int. Cl.[3] .......... B23K 37/00; H05K 3/34

[52] U.S. Cl. .......... 228/57; 428/122

[58] Field of Search .......... 228/39, 57, 180 R, 215; 118/505; 428/83, 122, 358; 24/255 R

[56] References Cited

U.S. PATENT DOCUMENTS

| | | | |
|---|---|---|---|
| 3,086,264 | 4/1963 | Tindall | 24/255 R X |
| 3,759,436 | 9/1973 | Foster et al. | 228/57 |
| 4,068,792 | 1/1978 | Dixon | 228/57 |
| 4,105,814 | 8/1978 | Eggert | 428/122 |

FOREIGN PATENT DOCUMENTS

| | | | |
|---|---|---|---|
| 2278220 | 3/1976 | France | 339/17 LC |

*Primary Examiner*—Kenneth J. Ramsey
*Attorney, Agent, or Firm*—John A. Haug; James P. McAndrews; Melvin Sharp

[57] ABSTRACT

A circuit board edge member includes an elongated body of electrically insulative material having front, back and inner wall member and a plurality of pairs of contact elements seated with one of each pair between the front and inner walls and the other of each pair between the back and inner walls. A tongue is integrally attached to the inner wall and extends from the body in line with a circuit board receivable at a circuit board seat formed in the body. The contact elements are formed with a gold inlay solid phase bonded to a portion of the contact element which is received on opposite faces of the tongue. The tongue has a reverse taper and may be slotted to provide polarization. Mounting ears may be provided on opposite ends of the base to facilitate attachment of the edge member to a circuit board using conventional screw fasteners or snap in devices. The edge member is assembled by inserting contacts while still attached to a carrier web in two opposite directions, severing the contacts from the carrier web and bending their pin ends to form two rows of contact pins receivable in two rows of holes in the circuit board. A flexible, U-shaped mask is placed over the tongue to prevent contamination during wave soldering.

2 Claims, 15 Drawing Figures

MASK FOR AN ATTACHABLE, CIRCUIT-TERMINATING, CIRCUIT BOARD EDGE MEMBER

CROSS REFERENCE TO RELATED APPLICATION

The description herein is also included in patent application Ser. No. 154,343 filed on May 29, 1980 in the name of Salvatore P. Rizzo and assigned to the assignee hereof.

BACKGROUND OF THE INVENTION

This invention relates generally to circuit boards and more particularly to means for making electrical connection with such boards.

Conventionally, circuit boards have been constructed with gold tabs disposed on an edge of the board to facilitate connection with an edge board connector or the like. The circuit board is processed to complete the various circuit paths, that is, the various processing steps of masking, etching, stripping and the like are completed to make a functional board and only then are the gold tabs applied. The additional processing steps to apply the gold, as by plating, plus the gold which is lost during the plating process has made this approach inherently expensive and highly labor intensive. With the escalation of labor costs as well as gold prices the problem is becoming exacerbated so that attempts have been made to provide a cost effective yet reliable connector system which would obviate the use of gold on the circuit boards.

For example, attempts have been made to provide a two part connector with one part permanently attached to a circuit board by reflow or wave soldering and having a tab portion which mates with a conventional edge board connector. One such device comprises an electrically insulative body placed on the circuit board adjacent an end thereof. The body is formed with a tab portion offset from the circuit board and projecting therefrom serving as a support for the contacts receivable in the edgeboard connector. One of the disadvantages associated with this device is that the offset feature of the tab renders it unusable in many assemblies where the circuit boards are disposed very close to one another or to the frame or other elements of the assembly.

Another system employs a body having a circuit board seat formed therein with a contact supporting tab projecting from the body aligned with a circuit board received at the circuit board seat. A disadvantage of this system is that the contacts supported on the body are exposed and are subject to possible short circuiting.

SUMMARY OF THE INVENTION

It is an object of the present invention to provide apparatus for replacing gold connecting pads formed on an edge of a circuit board with a highly reliable yet cost effective connecting means. Another objective is the provision of an attachable, circuit-terminating, circuit board edge member in which the contact elements are wave solderable to the circuit paths of the circuit board and are easily flushed to clean the circuit board and the edge member of contaminants. Another objective is to provide a method for assembling circuit board edge members which is particularly suitable for automation. Yet another objective is the provision for suitable protection means for preventing contamination of the contact surfaces from wave soldering operations associated with attaching the edge member to a circuit board. Other objects and features will be in part apparent and in part pointed out hereinafter.

Briefly, in accordance with the invention an attachable, circuit-terminating, circuit board edge member comprising an elongated body of electrically insulative material has a tongue which extends from the body in line with a circuit board receivable at a circuit board seat formed in the body. A lower contact element is provided with a solder tail or pin end extending upwardly from the upper portion, an intermediate, transversely extending portion and a lower contact surface portion which is received in a vertically disposed groove in the back surface of the tongue, the groove having a depth slightly less than the thickness of the contact surface portion. The contact surface portion is pre biased against the tongue so that it will be in close physical contact with the bottom surface of the groove. The tip end of the contact surface portion is bent inwardly toward the tongue and is received in a mating recessed portion of the groove.

An upper elongated contact element is provided with an upper solder tail or pin end, an intermediate transversely extending portion and a lower contact surface portion and is provided with a protuberance which reacts with the front wall to bias the lower contact surface portion firmly against a vertically extending groove formed in the front surface of the tongue, the groove having a depth slightly less than the thickness of the lower contact surface portion. The tip end of the lower contact surface portion is bent inwardly toward the tongue and is received in a mating recessed portion of the groove.

The tongue is formed with a slight reverse taper, in the order of 2°, formed in the front surface thereof. A key slot may be formed in the tongue extending therethrough from front to back to provide polarization means.

Mounting ears may be located at both ends of the body, each being provided with a bore therethrough to receive either a standard threaded fastener or a snap in version to facilitate attachment to a circuit board.

The edge member may be assembled by forming a plurality of upper contact elements with their solder tail ends attached to a carrier web and moving the web in a first direction relative to the body so that the contact elements are received in their respective seats. A plurality of lower contact elements are formed with their tip ends attached to another carrier web which is moved in a second direction opposite to the first so that the contact elements are received in their respective seats. The contact elements are severed from the webs and the solder tail ends are bent toward the front of the body passing through a plane in which the circuit board seating surface lies forming two rows of solder tails which are receivable in matching apertures of a circuit board placed on the circuit board seat. Set off surfaces are provided to maintain the circuit board a selected distance from the inner and front walls of the body to provide optimum flushing capabilities. A generally U-shaped flexible mask of silicone rubber is disposed on the tongue to provide contamination of the contact elements during wave soldering of the solder tip ends to the circuit board.

Figure 1:
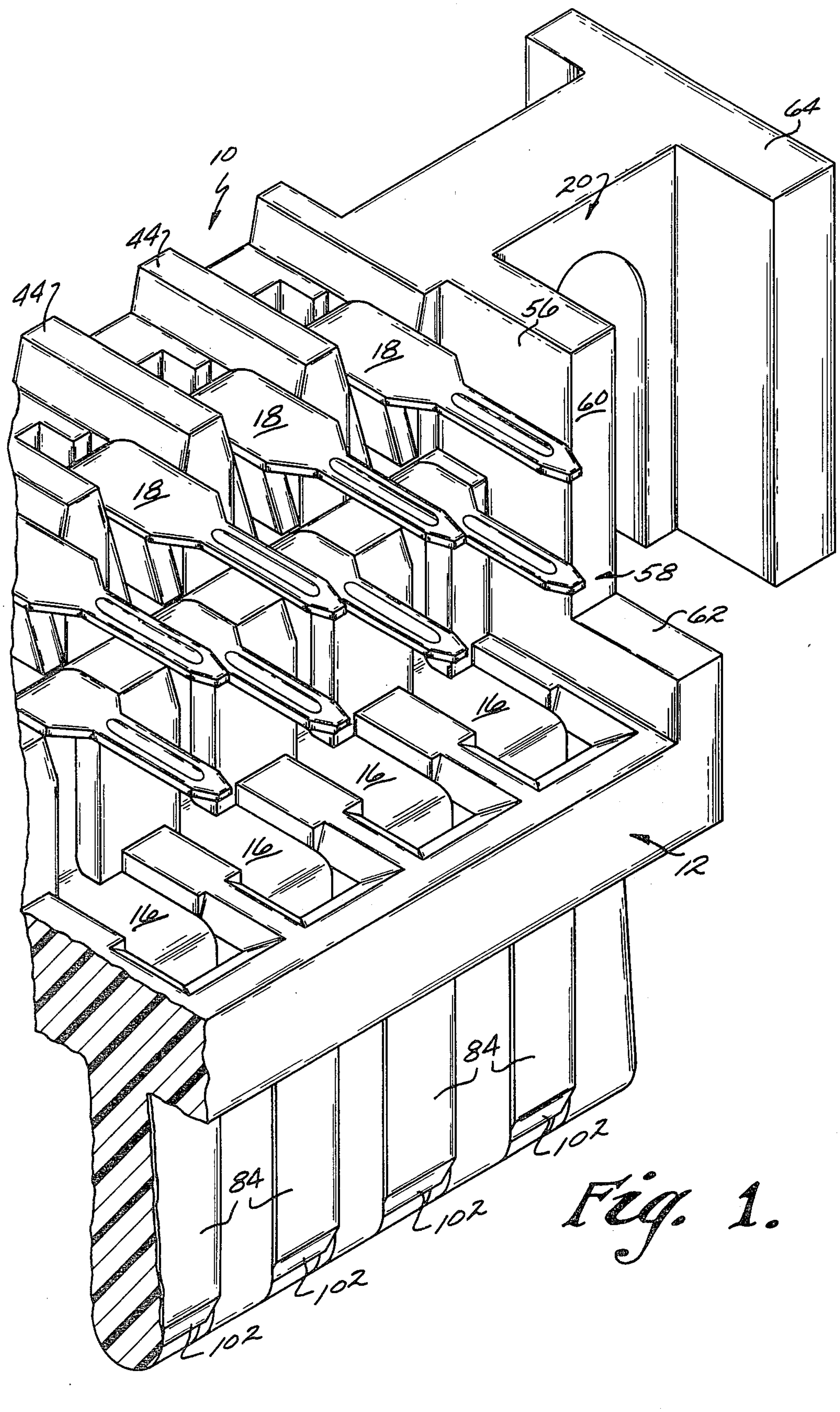
FIG. 1 is a perspective of a portion of the attachable, circuit-terminating, circuit board edge member made in accordance with the invention.

Turning now to the drawings, numeral 10 refers generally to an attachable, circuit-terminating, circuit board edge member comprising a base member 12 composed of suitable electrically insulative, moldable material such as 30% glass filled polyester or 40% glass filled polyphenulene sulfide having a tongue portion 14, a plurality of upper contact elements 16, a plurality of lower contact elements 18 and circuit board attachment means 20.

As best seen in FIGS. 2–5 base member 12 is an elongated member adapted to house a plurality of individual contact elements comprising an upper chamber 22 and a lower chamber 24 separated from each other by an inner wall member 26.

Figures 2, 3:
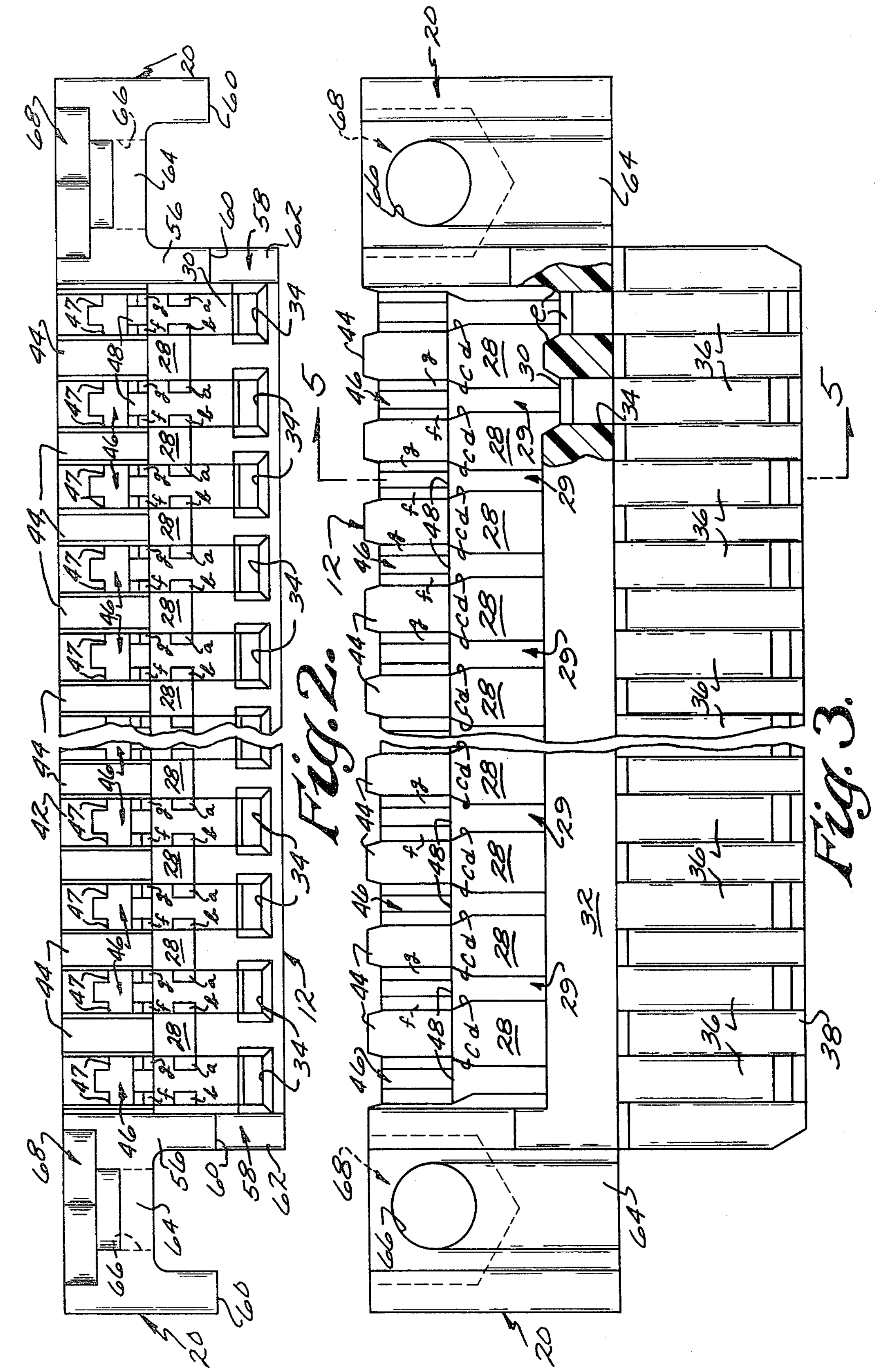
FIG. 2 is a top plan view of the FIG. 1 member with the contacts removed.
FIG. 3 is a front elevation of the FIG. 1 member with the contacts removed.
Figure 4:
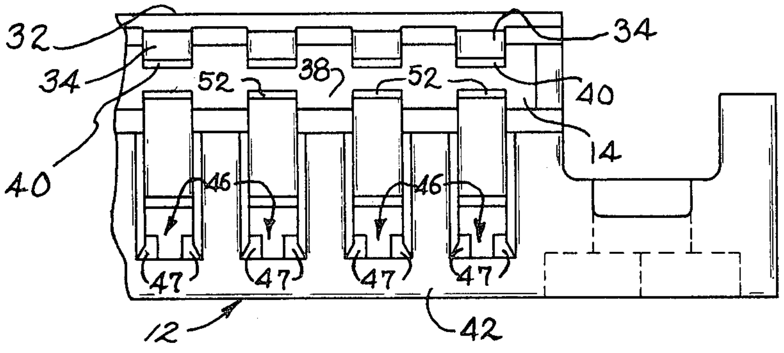
FIG. 4 is a bottom elevation of a portion of the FIG. 1 member with the contacts removed.
Figure 5:
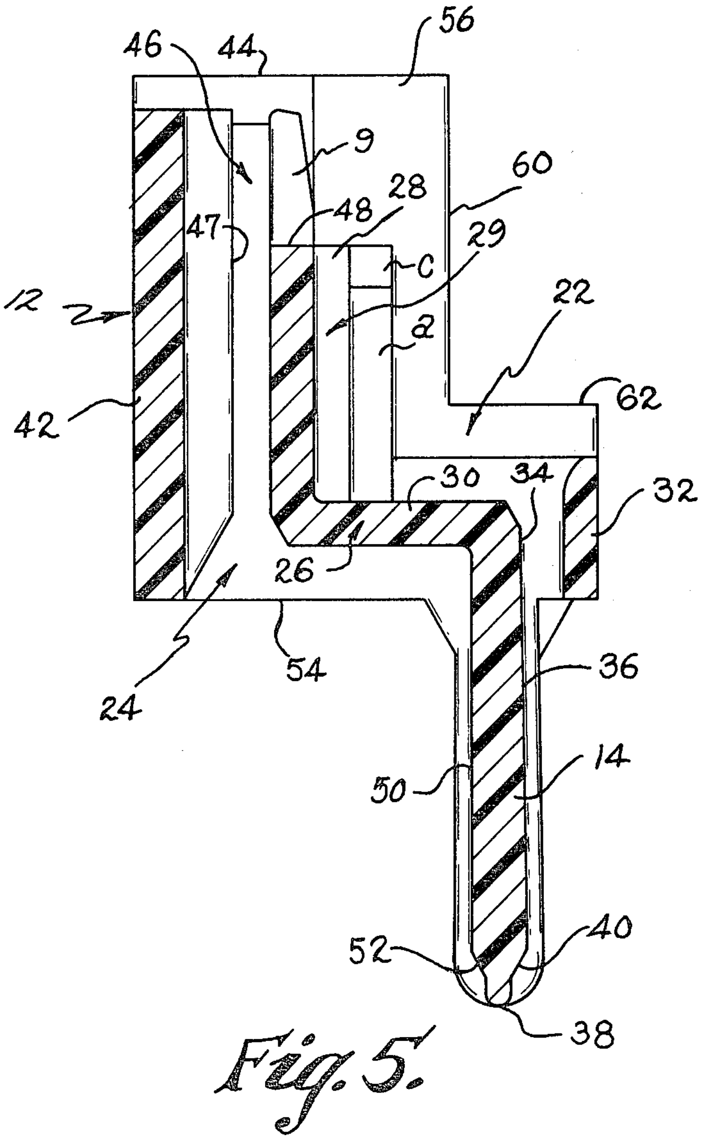
FIG. 5 is a cross sectional view of the FIG. 1 member with the contacts removed taken on lines 5—5 of FIG. 3.
Figure 6:
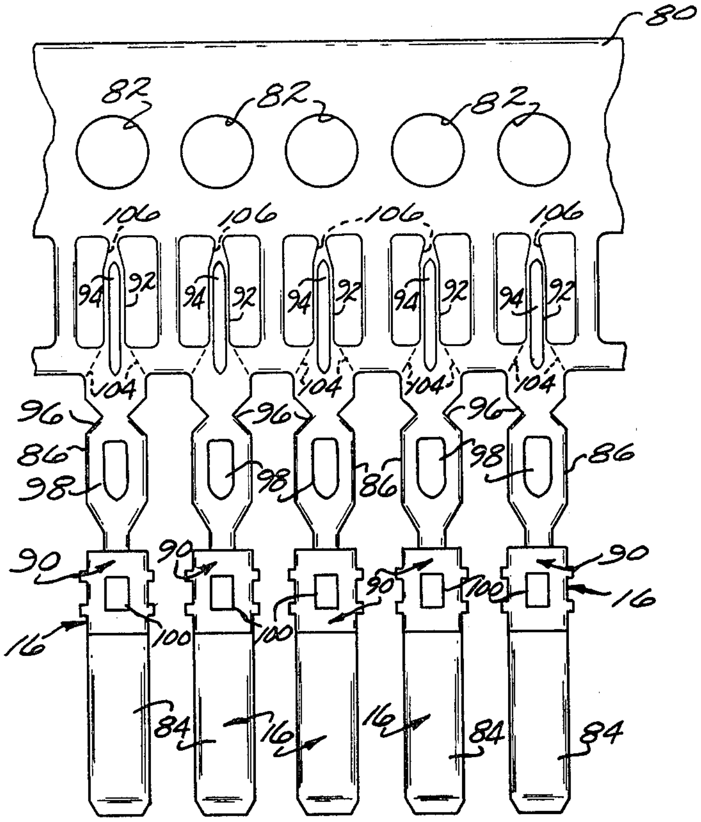
FIG. 6 is a front elevation of upper contact elements extending from a carrier web or support strip.
Figure 7:
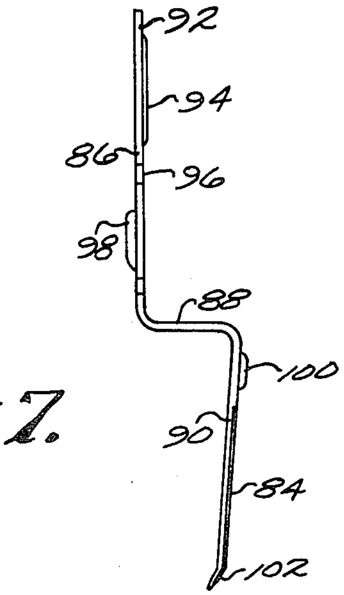
FIG. 7 is a side elevation of the FIG. 6 contact elements and support strip.
Figure 8:
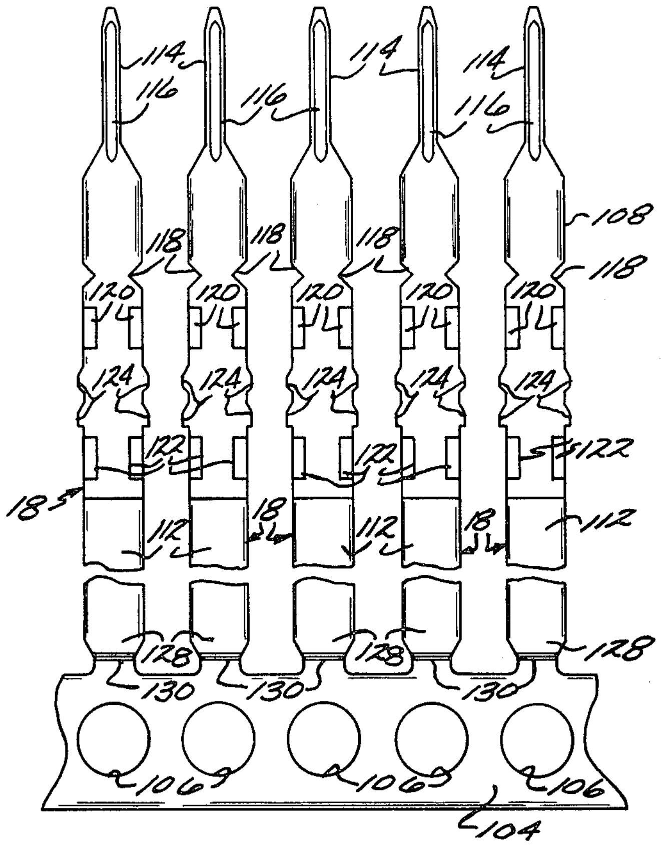
FIG. 8 is a front elevation of lower contact elements extending from a carrier web or support strip.

With respect to upper chamber 22 individual contact element seats are formed between vertically extending ribs which extend from a transversely extending portion 30 of inner wall member 26. Each rib 28 is formed with shoulders a and b in opposite vertically extending sides of the rib forming guideways 29 to accommodate contact elements as will be explained below. The top portions of shoulders a and b are chamfered at c and d respectively as seen in FIG. 3 in order to provide lead-in angles for the contact elements during assembly of the edge member.

A front wall 32 is formed with a plurality of vertically extending apertures 34 each in alignment with guideway 29. Apertures 34 are beveled at c to make alignability of the contact elements during assembly less critical.

Guideways 29 also extend in tongue 14 by means of slots 36 which extend to the free distal end 38 of tongue 14. The bottom surface of slots 36 lies in a plane which forms a slight angle, eg., approximately 2°, with a plane passing through the longitudinal axis of tongue 14 so that the lower portion of tongue 14 is thicker than the upper portion. The lower section of slot 36 is inwardly inclined at 40 to provide a recessed seat for the tip portion of the contact elements.

Lower chamber 24 is defined by a vertically extending rear wall 42 formed with a plurality of side walls 44 defining, along with inner wall member 26, individual guideways 46 for eventual reception of contact elements. Each guideway 46 is provided with a pair of upstanding ribs 47 projecting inwardly from rear wall 42 contiguous to the respective side walls 44 defining the guideway. Inner wall 26 extends upwardly from transversely extending portion 30 to 48 essentially the same height as ribs 28 of chamber 22 and from that level shoulders f and g, generally in the same plane as the upper portion of inner wall 26, extend up to the same height as rear wall 42. Guideways 46 extend along the bottom surface of transversely extending wall 30 and along vertically extending slots 50 in the rear side of tongue 14 to inwardly inclined surface 52 and finally distal end 38 of tongue 14. The portion of guideways 46 which extend along the bottom surface of wall portion 30 are separated from one another by depending walls 54 which are in alignment with the bottom of rear wall 42. It will be noted that slot 50 of guideway 46 is in lateral alignment with slot 36 of guideway 29.

End walls 56, which are parallel to side walls 44, are formed with a recessed portion 58 to form a seat for a circuit board to which the contact elements will be attached. Surfaces 60 and 62 maintain the circuit board a selected distance from inner wall 26 for a purpose to be explained infra.

Attachment means 20 comprise ears 64 extending laterally from each end wall 56 with a bore 66 extending through each ear. A recessed seat 68 is formed on the back wall of each ear 64 to accommodate a fastener and is preferably provided with angled wall portions 70, 72 which, in the event that a hexagonal threaded fastener is used, will prevent rotation thereof and thereby facilitate attachment of a threaded member to the fastener.

With particular reference to FIGS. 6-9 contact elements 16 and 18 will be described. The contact elements are formed of good electrically conductive material having good spring characteristics, such as a copper alloy. It has been found that CA 194 (a designation of the Copper Development Association) is suitable. Upper contacts 16 are stamped from a web 80 which is formed with indexing apertures during forming and assembly of the edge member 10. The lower portion of one face of web 80 is provided with a layer 84 of highly electrically conductive material, such as gold. Layer 84 is preferably applied prior to the stamping out of the individual contact elements. It has been found that an extremely cost effective, reliable way to apply layer 84 is by solid phase bonding in a manner well known in the art. In order to avoid undesirable intermetallic compounds between the gold and copper alloy interface it is preferred to use an underliner of approximately 150 microinches of nickel. The gold layer can be a suitable gold alloy such as 75% gold and 25% silver, at least 50 microinches in thickness. In one such device made in accordance with the invention, the overall thickness of the contact element material is approximately 0.008 inches.

Each contact element 16 is formed with an upper portion 86, a transversely extending intermediate portion 88 and a lower portion 90. Upper portion 86 culminates in a narrowed pinlike or solder tail configuration 92 and is preferably provided with a strengthening-rib-like longitudinally extending protrusion 94. A necked in portion 96 is provided to facilitate accurate bending of pin ends 92 upon assembly. A protrusion 98 is formed on the back side of upper portion 86 and a protrusion 100 is formed on the front side of lower portion 90. The outside edges of protrusion 100 are formed with arrowheads to enhance retention of contact element 16 in its slot. Lower portion 90 culminates in tip end portion 102 which is bent backwardly by approximately 20° from the general plane in which lower portion 90 lies. It will also be noted that the entire lower portion 90 below protrusion 100 is bent backward slightly, eg., approximately 9°, relative to upper portion 86 for a purpose to be explained below. Dashed lines 104, 106 indicate the location where the individual contact elements are severed from web 80 upon assembly of edge member 10.

Figure 9:
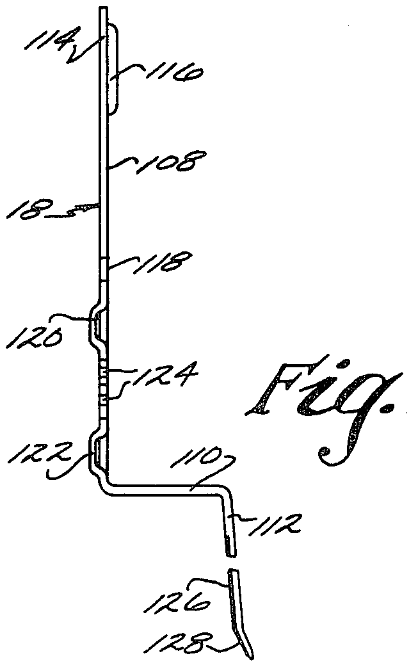
FIG. 9 is a side elevation of the FIG. 8 contact elements and support strip.
Figure 10:
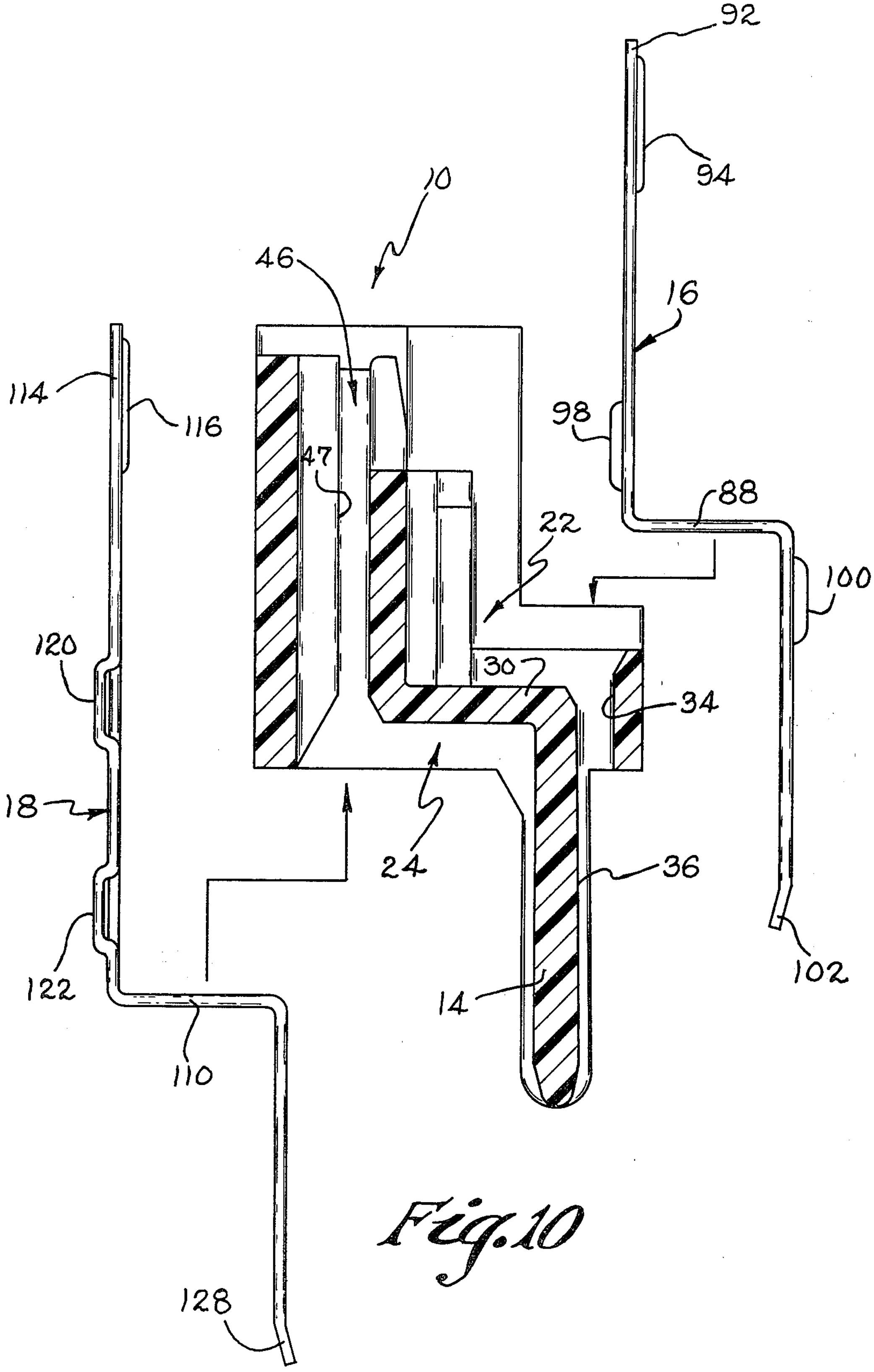
FIG. 10 is a schematic diagram showing how the attachable, circuit-terminating, circuit board edge member receives the upper and lower contact elements for assembly therein.
Figure 11:
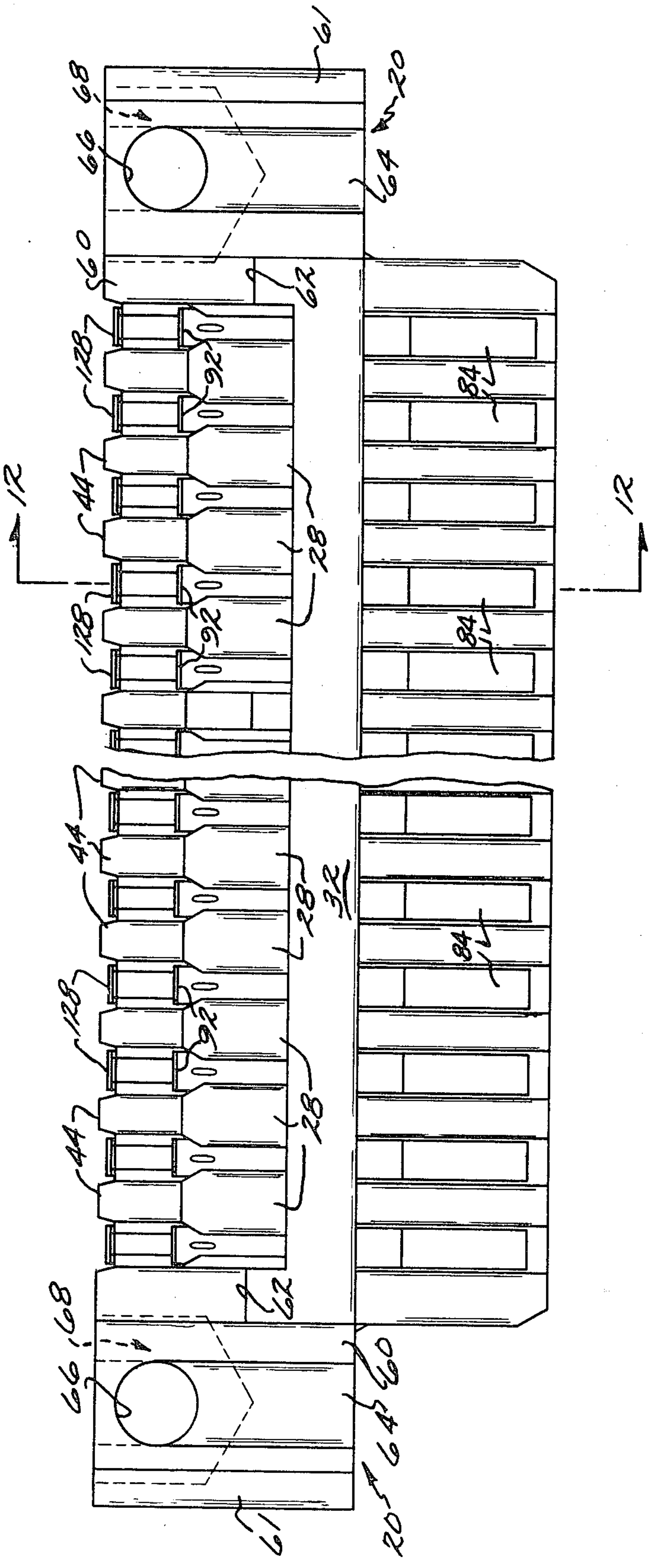
FIG. 11 is a front elevation of the attachable, circuit-terminating, circuit board edge member with the contacts received therein in assembled relation.

Lower contact elements 18 are formed of the same material as contact elements 16 and depend from web 104 having indexing apertures 106 which correspond to indexing apertures 82 on web 80. Each contact element 18 is formed with an upper portion 108, a transversely extending intermediate portion 110 and a lower portion 112. Upper portion 108 is formed with a pinlike or solder tail configuration 114 having a longitudinally extending, strengthening rib 116 protruding from the back surface thereof. A necked in portion 118 is provided to facilitate accurate bending of the pinlike portion 114 upon assembly. Pairs of protrusions 120, 122 are formed on the lower section of portion 108 on the front surface of contact element 18. Between protrusions 120, 122 arrowheads 124 extend outwardly from opposite sides of contact element and enhance retention of contact element 18 in the seat. Lower portion 112 is provided on its lower front surface with layer 126 of highly electrically conductive material of the same type and formed in the same manner as layer 84 of contact elements 16. Lower portion 112 culminates at tip end 128 which is bent backwardly approximately 20° from the general plane of lower portion 112. As seen in FIG. 9, lower portion 112 is bent so that it lies in a plane which forms a slight angle with the plane in which upper portion 108 lies, in the order of six degrees. Portion 110 preferably forms an angle of slightly less than 90° with portion 108, eg., in the order of 4%, in order to provide a spring bias to portion 110 against the lower wall 30 once the contact is assembled.

Contact elements 18 are severed from web 104 at line 130 at the time of assembly of edge member 10. It will be noted that contact elements 18 are connected to web 104 at their tips 128 while contact elements 16 are connected to web 80 at pin ends 92.

With particular reference to FIGS. 6, 8, 10 and 12, assembly of edge member 10 will now be explained. Webs 80 and 104 are passed along a path which brings them into alignment with the upper and lower chambers 22, 24, respectively. Web 80, which is disposed above upper chamber 22, is moved relative to base member 12 so that tips 102 are received through respective apertures 34 and intermediate portion 88 of upper contact elements 16 are seated on transverse wall 30. The pin ends 92 are then severed from the carrier web 80 at dashed lines 106 and the pins are bent 90° at respective neck portions 96. Web 104 is then moved, relative to body 12, so that pin ends 114 of lower contact elements 18 are received in respective guideways 46 with intermediate portion 110 bottoming against the lower surface of wall portion 30. Once contact elements are in place they are severed, as by breaking them away on scored line 130, from web 104. Pin ends 114 are then bent 90° at neck portions 118 so that they form with pins 92 two parallel rows projecting beyond a plane in which surface 60 lies for eventual reception in mating apertures of a printed circuit board.

Figure 12:
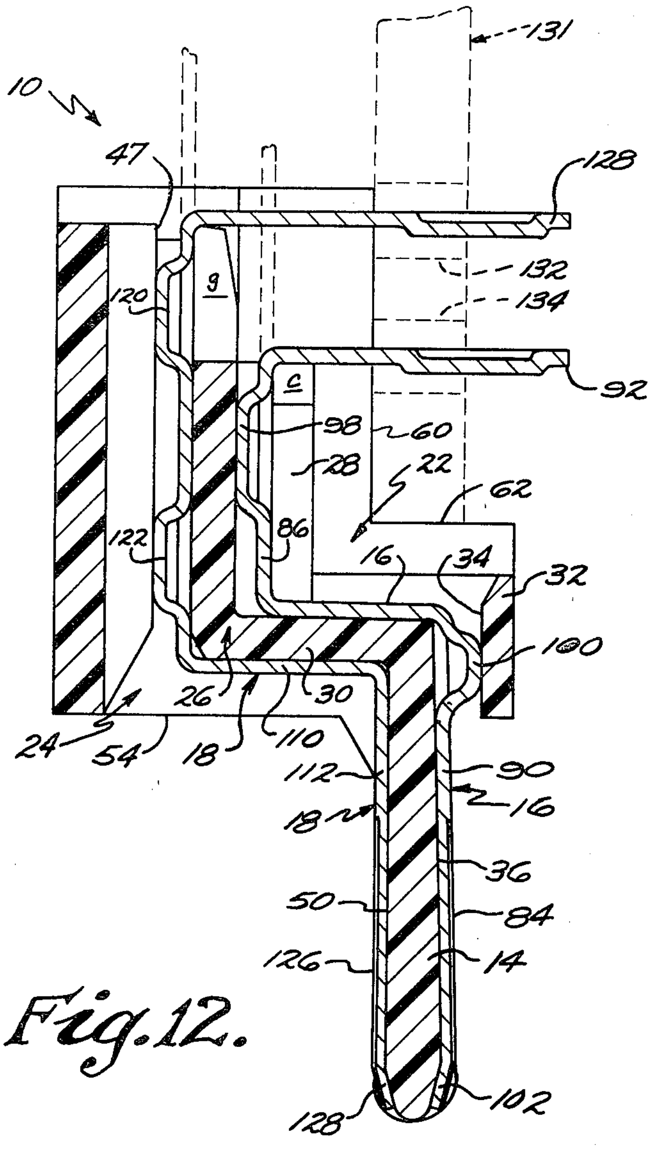
FIG. 12 is a cross sectional view taken on lines 12—12 of FIG. 11.

As seen in FIG. 12 contact element 16 is firmly seated in upper chamber 22 with upper body portion 86 received behind shoulders a, b of ribs 28 and protuberance 98 providing very slight clearance between ribs 28 and the front surface of wall 26. Protuberance 100 projects from lower body portion 90 sufficiently to form an interference fit in aperture 34 so that the lower body portion 90 is biased against tongue 14 in slot 36 even though there is a slight reverse taper. The depth of slot 36 is such that the outer surface of lower body portion 90 projects slightly beyond the outer surface or lands of tongue 14 between grooves 36 to ensure good electrical connection when tongue is inserted in a socket unit even if a slight misalignment occurs between mating contact parts. The chamfered surfaces c, d, f and g in ribs 28 allow contact element lead-in angles to facilitate assembly thereof.

Lower contact element 18 is firmly seated in lower chamber 24 with the pairs of protuberances 120 and 122 providing very slight clearance with ribs 47 and intermediate body portion 110 bottomed against the lower surface of wall portion 30. The bottom surface of grooves 50, and the lands therebetween form a right angle with the bottom surface of wall portion 30 so that the slight angle that lower body portion 112 is bent to 90° is sufficient to ensure that body portion 112 is firmly biased against the bottom surface of groove 50. As in the case of contact elements 16, the depth of groove 50 is such that the outer surface of body portion 112 extends slightly, eg., on the order of 0.001 inch, beyond the lands of tongue 14 between grooves 50. Tip ends 102, 128 are bent inwardly and well beneath the outer surface of tongue 14 so that there is no possibility of the tips catching and being forced from their proper seats upon insertion of tongue 14 in a mating socket.

Figure 13:
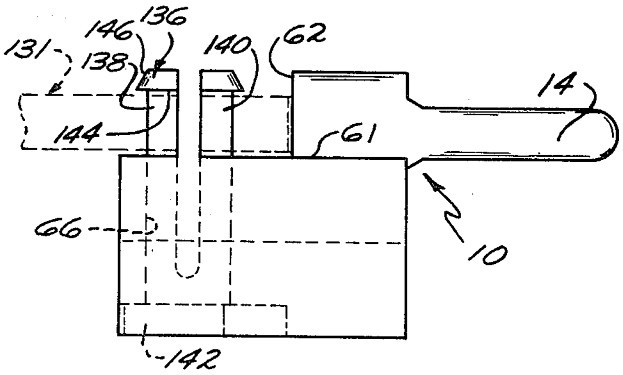
FIG. 13 is a side elevation showing the attachable, circuit-terminating, circuit board edge member with a portion of an attached circuit board shown in dashed lines.

As seen in FIGS. 12 and 13 a conventional circuit board 131 having two rows of apertures 132, 134 (only one aperture for each row is indicated in FIG. 12) is disposed on standoff surfaces 60, 62 with pin portions 128 and 92 received in and extending through apertures 132, 134 respectively. Circuit-terminating, circuit board edge member 10 may then be fastened to circuit board 131 using conventional screws received through bores 66 of ears 64 with respective nuts received in recessed seat 68. Alternatively, a snap in fastener 136 may be employed such as that shown in FIG. 13. Fastener 136, either plastic or metal, is provided with a plurality of legs, such as legs 138, 140, shown extending from head 142 to a lip 144. Lip 144 is provided with a chamfered surface 146 to facilitate insertion of the fastener into a bore by camming legs 138, 140 together. Once lip 144 passes all the way through the receiving bore of the circuit board the legs are then allowed to spring outwardly with lip 144 locking the board to member 10.

Figure 14:
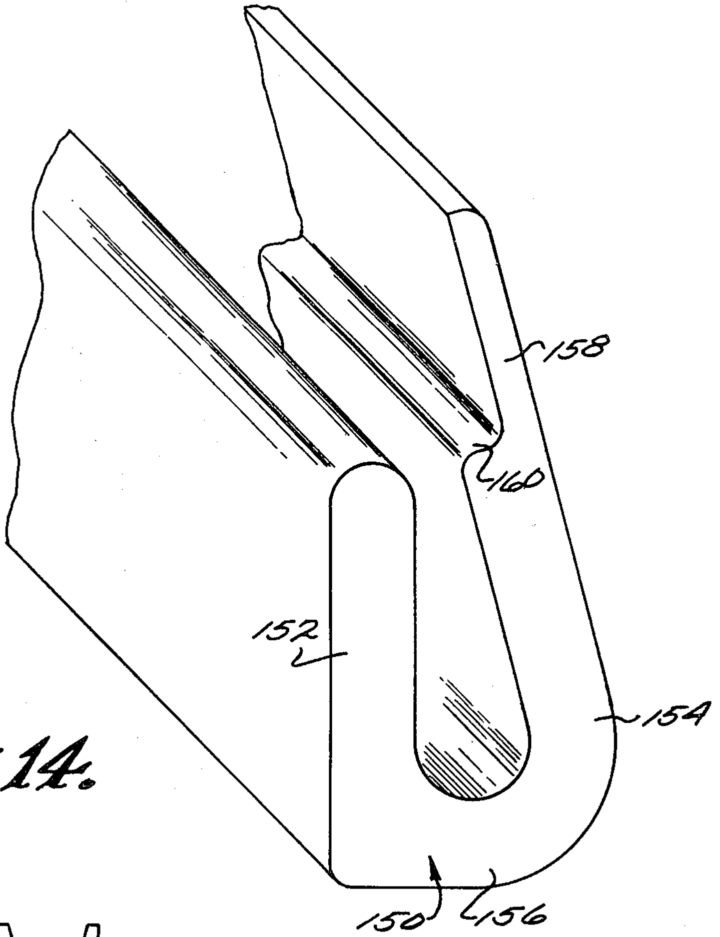
FIG. 14 is a perspective view of a portion of the length of a detachable solder mask.

Once circuit board 130 is fastened to the circuit-terminating, circuit board edge member 10 the assembly is ready for completing the electrical connection between solder tails 92, 128 and respective circuits on board 131. This may conveniently be accomplished by passing the assembly through a conventional wave soldering apparatus. During this operation it is preferred that solder mask 150, FIG. 14, be disposed on tongue 14 to prevent any contaminants from reaching the contact surfaces 84, 126 of contact elements 16, 18. Solder mask 150 is formed of a flexible material, such as silicone, rubber, and is configured generally as an elongated U-shaped member having a first leg 152 joined to a second leg 154 by bight portion 156. Second leg 154 converges toward the distal free end of first leg 152 to a distance which is significantly less than the thickness of tongue 14, for example in the order of one half the thickness. Legs 152, 154 at their bight are separated from one another by a distance slightly greater than the width of tongue 14. Leg 154 is provided with an extension 158 which extends from a shelf portion 160. When placed on circuit board edge member 10 tongue 14 is received between legs 152, 154 with the free distal end of leg 152 disposed contiguous to wall 54 of edge member 10 and shelf 160 received under wall 32 with extension 158 overlying the outer surface of wall 32. The length of mask 150 is chosen so that when placed on tongue 14 all of the contact elements 16, 18 are completely covered. Thus the entire tongue is protected from contamination during the soldering operation. If desired to enhance exclusion of contamination, inwardly extending skirt portion (not shown) can be added to the end of extension 158 adapted to curl over the top of front wall 32. Following that operation mask 150 is removed and may be used on other edge members which are to be subjected to the soldering operation. As previously noted, the circuit boards 130 are positioned or set off relative to body 12 of member 10 by surfaces 60, 62. This permits effective flushing all around the edge of circuit board.

Figure 15:
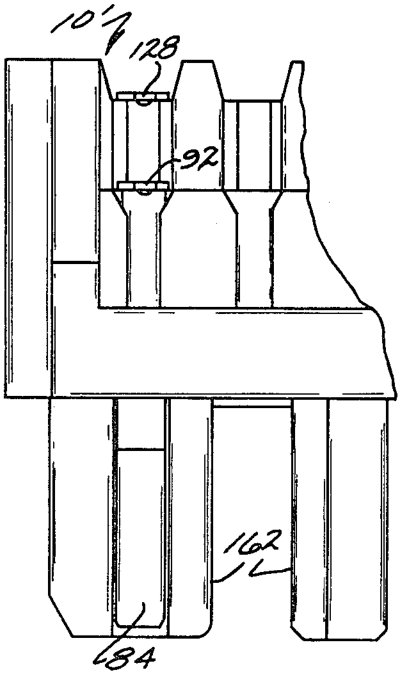
FIG. 15 is a broken away front elevation showing an alternative embodiment of the invention.

Although edge member 10 has been shown as having mounting ears 20 it will be understood that, as seen in FIG. 15, edge members 10 can be provided without these ears so that a plurality of such members can be disposed adjacent one another with the contact elements of an edge member more closely spaced to its adjacent edge members. Further, it may be desirable to provide polarization or keying means. This may conveniently be accomplished by providing a slot 162 transversely across the tongue either at one of the groove 36, 50 locations as seen in FIG. 15, or at a land between adjacent grooves.

It will therefore be seen that a high reliability connector system is described which obviates the need for the conventional gold plated fingers arranged on circuit boards. The contact elements are so disposed that the aligned contact surfaces 84, 126 lie in essentially the same plane as respective faces of the attached circuit board 130 thereby enabling use of edge members 10 interchangeably with circuit boards having the conventional gold plated fingers. That is, the center line of the edge member tongue and the circuit board are coincident and the envelope dimensions are generally the same as the printed circuit board tab with gold plated fingers. The reverse taper of slots 36 on tongue 14 serves to hold edge member 10 securely seated in a mating edgeboard connector and renders it less sensitive to vibration.

Various changes and modifications in the above described embodiments will be readily apparent to those skilled in the art and any of such changes or modifications are deemed to be within the spirit and scope of the present invention as set forth in the appended claims.

What is claimed is:

1. A mask for use with an attachable, circuit-terminating circuit board edge member having an elongated body with a tongue having a selected thickness and a front and back depending from the edge member along its length, a plurality of pairs of contact elements, one of each pair disposed on the front of the tongue and the other of each pair disposed on the back of the tongue, each of the contact elements formed with a solderable pin end which extends from the edge member, comprising an elongated, generally U-shaped mask formed of flexible material, the mask having first and second legs of approximately the same length extending from a bight portion to respective free distal end portions, the legs having a length at least as long as the distance the tongue extends from the body and having an inner surface, an extension formed on the first leg, the extension extending generally in the same direction as the first leg but offset from the inner surface of the first leg to form a shelf which extends along the length of the mask, the legs being spaced from one another at their bight a distance of slightly more than the said selected thickness of the tongue and at their distal end portions a distance approximately one half the said selected thickness of the tongue.

2. A mask for use with an attachable, circuit-terminating, circuit board edge member according to claim 1 in which the mask is formed of silicone rubber material.

* * * * *